(12) United States Patent
Ding et al.

(10) Patent No.: US 10,163,762 B2
(45) Date of Patent: Dec. 25, 2018

(54) LEAD FRAME WITH CONDUCTIVE CLIP FOR MOUNTING A SEMICONDUCTOR DIE WITH REDUCED CLIP SHIFTING

(71) Applicant: Vishay General Semiconductor LLC, Hauppauge, NY (US)

(72) Inventors: Hui-Ying Ding, Tianjin (CN); Pengnian Wang, Tianjin (CN); Tao Yu, Tianjin (CN); Jun-Feng Liu, Tianjin (CN); Jun-Kai Bai, Tianjin (CN); Chih-Ping Peng, Taipei (TW)

(73) Assignee: VISHAY GENERAL SEMICONDUCTOR LLC, Hauppauge, NY (US)

( * ) Notice: Subject to any disclaimer, the term of this patent is extended or adjusted under 35 U.S.C. 154(b) by 93 days.

(21) Appl. No.: 14/735,229

(22) Filed: Jun. 10, 2015

(65) Prior Publication Data

US 2016/0365305 A1    Dec. 15, 2016

(51) Int. Cl.
| | |
|---|---|
| *H01L 23/48* | (2006.01) |
| *H01L 23/52* | (2006.01) |
| *H01L 29/40* | (2006.01) |
| *H01L 23/495* | (2006.01) |
| *H01L 21/52* | (2006.01) |
| *H01L 21/56* | (2006.01) |
| *H01L 23/31* | (2006.01) |
| *H01L 21/60* | (2006.01) |

(52) U.S. Cl.
CPC ........ *H01L 23/49575* (2013.01); *H01L 21/52* (2013.01); *H01L 21/56* (2013.01); *H01L 23/3107* (2013.01); *H01L 23/3114* (2013.01); *H01L 23/49517* (2013.01); *H01L 2021/6027* (2013.01); *H01L 2021/60277* (2013.01); *H01L 2224/33* (2013.01); *H01L 2924/181* (2013.01)

(58) Field of Classification Search
CPC ....... H01L 23/49517; H01L 2021/6027; H01L 2021/60277; H01L 23/495759
USPC .................. 257/666, 676, 735, 739; 438/123
See application file for complete search history.

(56) References Cited

U.S. PATENT DOCUMENTS

| | | | | |
|---|---|---|---|---|
| 4,935,803 A | * | 6/1990 | Kalfus | H01L 23/49562 |
| | | | | 257/673 |
| 8,299,620 B2 | * | 10/2012 | Tanaka | H01L 23/49524 |
| | | | | 257/691 |
| 8,564,110 B2 | * | 10/2013 | Xue | H01L 23/49513 |
| | | | | 257/666 |

(Continued)

*Primary Examiner* — S. V. Clark
(74) *Attorney, Agent, or Firm* — Stuart H. Mayer; Mayer & Williams PC

(57) ABSTRACT

A semiconductor assembly includes a semiconductor die comprising lower and upper electrical contacts. A lead frame having a lower die pad is electrically and mechanically connected to the lower electrical contact of the die. An upper conductive member has a first portion electrically and mechanically connected to the upper electrical contact of the die. A lead terminal has a surface portion electrically and mechanically connected to a second portion of the conductive member. The surface portion of the lead terminal and/or the second portion of the conductive member has a series of grooves disposed therein. Packaging material encapsulates the semiconductor die, at least a portion of the lead frame, at least a portion of the upper conducive member and at least a portion of the lead terminal.

19 Claims, 3 Drawing Sheets

(56) References Cited

U.S. PATENT DOCUMENTS

| | | | |
|---|---|---|---|
| 2003/0075785 A1* | 4/2003 | Crowley | H01L 23/49513 |
| | | | 257/676 |
| 2009/0057854 A1 | 3/2009 | Gomez | |
| 2009/0218673 A1* | 9/2009 | Sun | H01L 23/49524 |
| | | | 257/690 |
| 2009/0224383 A1 | 9/2009 | Cruz et al. | |
| 2010/0109147 A1* | 5/2010 | Autry | H01L 23/4334 |
| | | | 257/692 |
| 2011/0227205 A1* | 9/2011 | Lu | H01L 23/49524 |
| | | | 257/670 |
| 2013/0256852 A1 | 10/2013 | Wyant et al. | |
| 2014/0103510 A1 | 4/2014 | Andou | |
| 2014/0273344 A1 | 9/2014 | Terrill et al. | |
| 2015/0097195 A1* | 4/2015 | Wada | H01L 33/62 |
| | | | 257/76 |

\* cited by examiner

LEAD FRAME WITH CONDUCTIVE CLIP FOR MOUNTING A SEMICONDUCTOR DIE WITH REDUCED CLIP SHIFTING

BACKGROUND

Rapid growth in the electrical industry has produced a need for electrical devices that are smaller in size but that operate in high-power architectures to support multiple features/functions. A high-power device generally supports high current and produces very high-power, which requires the device to have efficient heat dissipation capabilities. Typical two-terminal surface-mount discrete power semiconductor devices consist of a lead frame on which the cathode/bottom side of a semiconductor die or chip is mounted, and a clip that connects to the anode/top side of a semiconductor die. Manufacturers have started using conductive clips for high-power devices instead of gold wire or aluminum wire to connect the thin layer of metal on the top of die to the leads of the lead frame.

The clip attaching process for attaching the conductive clips to components of the device typically include cutting the clip from a clip reel, picking up the clip from the clip reel, and attaching the clip to the die surface. Use of conducting clips however introduces issues like clip movement that have increased the difficulty and cost of manufacturing the semiconductor package and reduced the units per hour ("UPH") rate in assembly.

SUMMARY

In accordance with one aspect of the subject matter disclosed herein, a semiconductor assembly includes a semiconductor die comprising lower and upper electrical contacts. A lead frame having a lower die pad is electrically and mechanically connected to the lower electrical contact of the die. An upper conductive member has a first portion electrically and mechanically connected to the upper electrical contact of the die. A lead terminal has a surface portion electrically and mechanically connected to a second portion of the conductive member. The surface portion of the lead terminal and/or the second portion of the conductive member has a series of grooves disposed therein. Packaging material encapsulates the semiconductor die, at least a portion of the lead frame, at least a portion of the upper conducive member and at least a portion of the lead terminal.

In accordance with another aspect of the subject matter disclosed herein, a method of forming a semiconductor assembly is provided. In accordance with the method, a conductive adhesive is applied to a die pad of a lead frame. A semiconductor die is positioned on the die pad so that a lower electrode of the semiconductor die is in contact with the conductive adhesive. Conductive adhesive is applied to an upper electrode of the semiconductor die. A pattern of grooves is formed in a surface portion of a lead terminal. Conductive adhesive is applied to the surface portion of the lead terminal in which the grooves are formed. A conductive member is positioned so that a proximal portion thereof is in contact with the conductive adhesive on the upper electrode of the semiconductor die and a distal portion thereof is in contact with the conductive adhesive on the surface portion of the lead terminal in which the grooves are formed. Heat is applied to cause the conductive adhesive on the upper electrode of the semiconductor die, the surface portion of the lead terminal and the die pad to reflow. The semiconductor chip, at least a portion of the lead frame, at least a portion of the upper conducive member and at least a portion of the lead terminal is encapsulated in packaging material.

DETAILED DESCRIPTION

A semiconductor package assembly is provided that includes a semiconductor die and a conductive clip and provides an assembly suitable for high-power applications. Clip bonding is used in a number of semiconductor package assemblies, including, for example, surface mount packages, power packages and bridge rectifier packages. In one embodiment, the assembly process generally includes forming a first joint between a die pad on which the semiconductor die is mounted and forming a second joint between the semiconductor die and a conductive member of the clip. A third joint is formed between the conductive member and a lead terminal, which collectively form the clip. The surface of the conductive member and/or the surface of the lead terminal that form the third joint have grooves formed therein enhance the strength of the joint and reduce clip movement during the subsequent solder reflow process.

The following description provides specific details for a thorough understanding of embodiments of a semiconductor assembly semiconductor assembly formation process. However, one skilled in the art will understand that the assembly and process described herein may be practiced without these details. In other instances, well-known structures and functions have not been shown or described in detail to avoid unnecessarily obscuring the description of the embodiments described herein.

Figure 1:
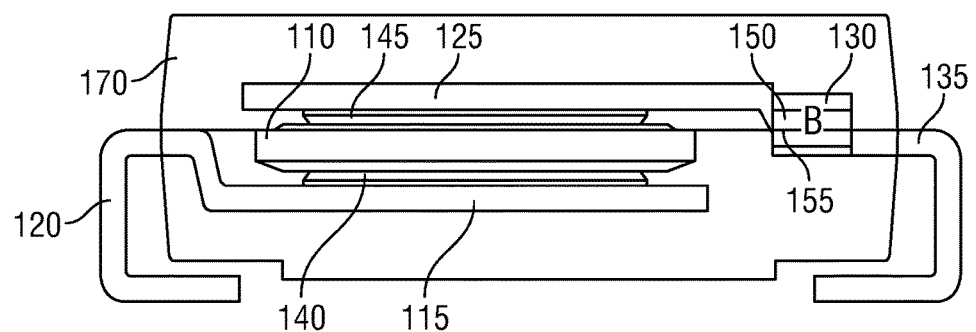
FIG. 1 is a cross-sectional view of one example of a semiconductor chip package.

One example of a semiconductor chip package 100 is schematically shown in the cross-sectional view of FIG. 1. As shown, a die or chip 110 is located on a die pad 115 of a lead frame 120. By way of example the die 110 may be a two terminal device such as a diode, a transient voltage suppressor or an LED. The die 110 is soldered to the surface of the die pad 115 using solder 140 so as to establish electrical contact between the die pad 115 and an electrode on a lower surface of the die 110. Likewise, the die 110 is soldered to the surface of an end of a conductive member 125 proximal to the die 110 using solder 145. The solder 145 establishes electrical contact between the conductive member 125 and an electrode on the upper surface of the die 110. The electrodes of the die 110 are formed from exposed regions of metal or other electrically conductive material that are in electrical contact with corresponding semiconductor device structures within the die 110.

The die pad 115 and conductive member 125 may be formed from any suitable electrically conductive material such as copper (Cu), aluminum (Al), nickel, titanium (Ti), or alloys based on these metals.

An end of the conductive member 125 distal to the die 110 has a contact surface 130 that is in electrical contact with an upper surface 155 of a lead terminal 135. Solder 150 is used to establish contact between contact surface 130 and the upper surface 155 of the lead terminal 135. The conductive member 125 and the lead terminal 135 form a conductive clip.

A packaging enclosure 170 is formed around the components of the semiconductor device. In particular, the die 110, die pad 115, conductive member 125, solder 140, 145 and 150 and portions of the lead frame 120 and lead terminal 135 are encapsulated or encased in an epoxy or other suitable compound as appropriate to the device.

During the package assembly process, the clip is formed by placing solder on both the upper surface of the die 110 and the upper surface of the lead terminal 135. The conductive member 115 is placed over the solder and acts like a bridge between the die 110 and lead terminal 135. After being properly positioned, the assembly is heated in a furnace to cause the solder to reflow, which secures the conductive member 125 in place after cooling.

Figure 2A:
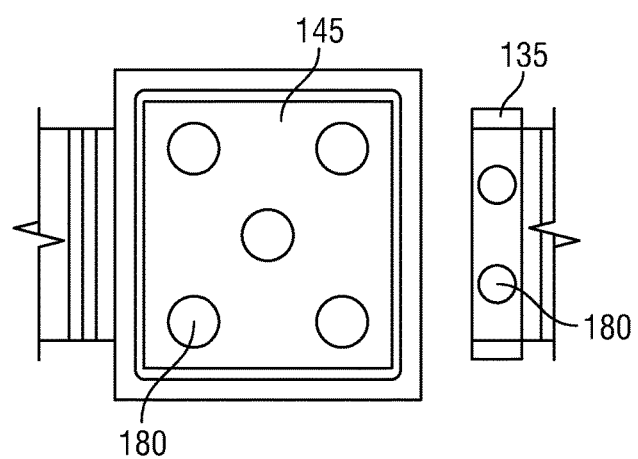
FIG. 2a shows a plan view of the chip subassembly before the conductive member is put in place and FIG. 2b shows the chip subassembly after the conductive member has been put in place and the solder has undergone reflow.
Figure 2B:
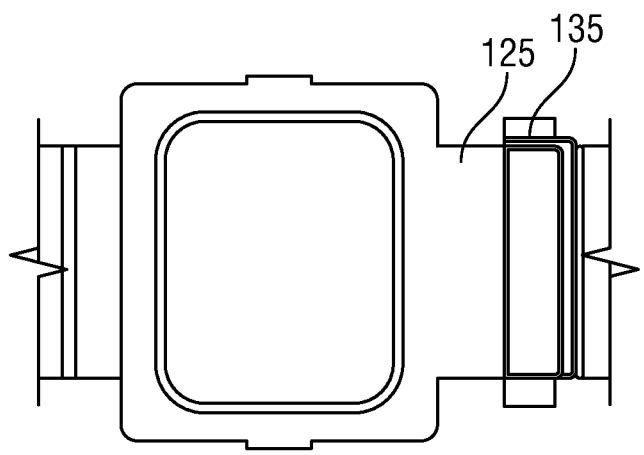

One problem that sometimes arises during the assembly process is that the position of the conductive member 125 shifts after reflow from the designated position in which it is placed. This problem is illustrated with reference to FIGS. 2a and 2b. FIG. 2a shows a plan view of the chip subassembly before the conductive member is put in place. As shown, solder paste 180 has been applied to both the upper surface of the die 110 and the upper surface of the lead terminal 135. FIG. 2b shows the chip subassembly after the conductive member 125 has been put in place and the solder has undergone reflow. In this case the conductive member 125 has shifted in the x-direction (i.e., the direction along the line connecting points A and B shown in FIG. 1) by a distance d from its position before reflow.

Clip shifting as described above can cause a variety of quality problems which may result in a deterioration in device performance, including possibly device failure. For example, problems such as device shorting or high current leakage may arise.

Without being bound to theory, clip shifting is likely caused by an imbalance in joint strength between the joints that are formed at points A and B in FIG. 1. In particular, the proximal joint at point A is formed by the conductive member 125, the solder 145 and the die 110 and, assuming the conductive member 125 is formed from copper, is composed of a copper layer, a solder layer and the chip metal (e.g., Au). On the other hand, the distal joint at point B is formed by the conductive member 125, solder and the lead terminal 135 and, assuming the lead terminal 135 is also formed from copper, is composed of a copper layer, a solder layer and a copper layer. The different materials of which the two joints are formed lead to different joint strengths.

In conventional chip assembly processes, clip shifting is sometimes controlled by adjusting the processing conditions. For example, the volume of the solder paste that is used and the soldering reflow temperature profile are adjusted so that chip shifting is reduced. Among other problems, however, these techniques may be subject to inconsistencies over time that lead to structural differences from package to package.

Instead of adjusting the processing conditions, the process described herein employs grooves that are formed in the surface of the conductive member 125 and/or the lead terminal 135 where the distal joint is formed. The grooves may have any of a variety of different profiles and may be, for instance, V-shaped or U-shaped. Additionally, the grooves may be patterned in different ways and may form, by way of example, a pattern of parallel lines, a grid of horizontal and vertical lines, a rhomboid pattern containing parallel lines, irregular or nonperiodic patterns, and so on. Such grooves can effectively control the shift of the clip frame so that the conductive member 125 remains in the position in which it is placed.

Figure 3:
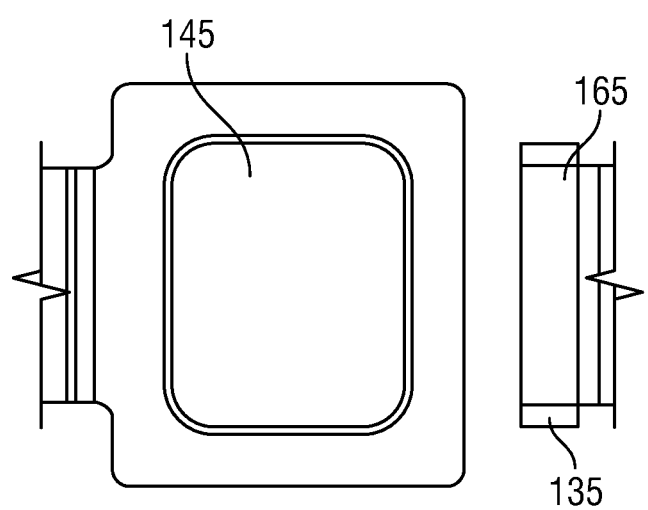
FIG. 3 shows a plan view of the chip subassembly before the conductive member is put in place and in which a series of parallel grooves are formed in the surface of the lead terminal to enhance bonding strength and reduce clip shifting after solder reflow.
Figure 4:
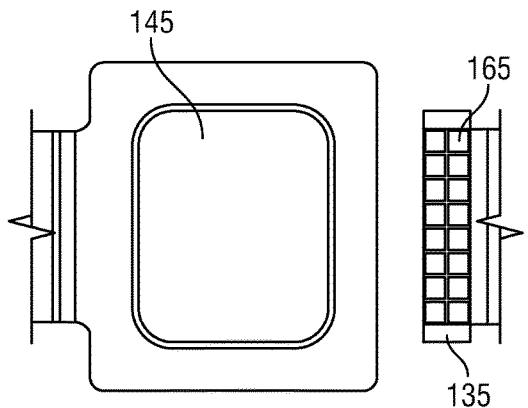
FIG. 4 shows a plan view of another chip subassembly before the conductive member is put in place and in which a grid pattern of grooves formed in the surface of the lead terminal to enhance bonding strength and reduce clip shifting after solder reflow.

Similar to FIG. 2a, FIG. 3 shows a plan view of the chip subassembly before the conductive member is put in place. In this case, grooves 165, which define a pattern of parallel lines, are formed in the surface of the lead terminal 135 which forms the distal joint B. FIG. 4 shows another plan view of the chip subassembly before the conductive member is put in place where the grooves 165 define a grid pattern.

The reduction in clip shifting that can be achieved using grooves as described above has been demonstrated in various package assembly applications. For example, in one process in which a number of semiconductor chip packages were formed, the shift in the conductive member that occurred between the time it was placed on the die and the time after reflow without the use of a grooved surface was found to range between about 2.52 mil and 7.81 mil. However, when a pattern of parallel grooves were formed in the surface of the conductive member, the shift was reduced to between about −1.19 mil and 4.21 mil. Likewise, when a grid pattern of grooves was employed, the shift was reduced to between about −1.41 mil and 3.30 mil.

Figure 5:
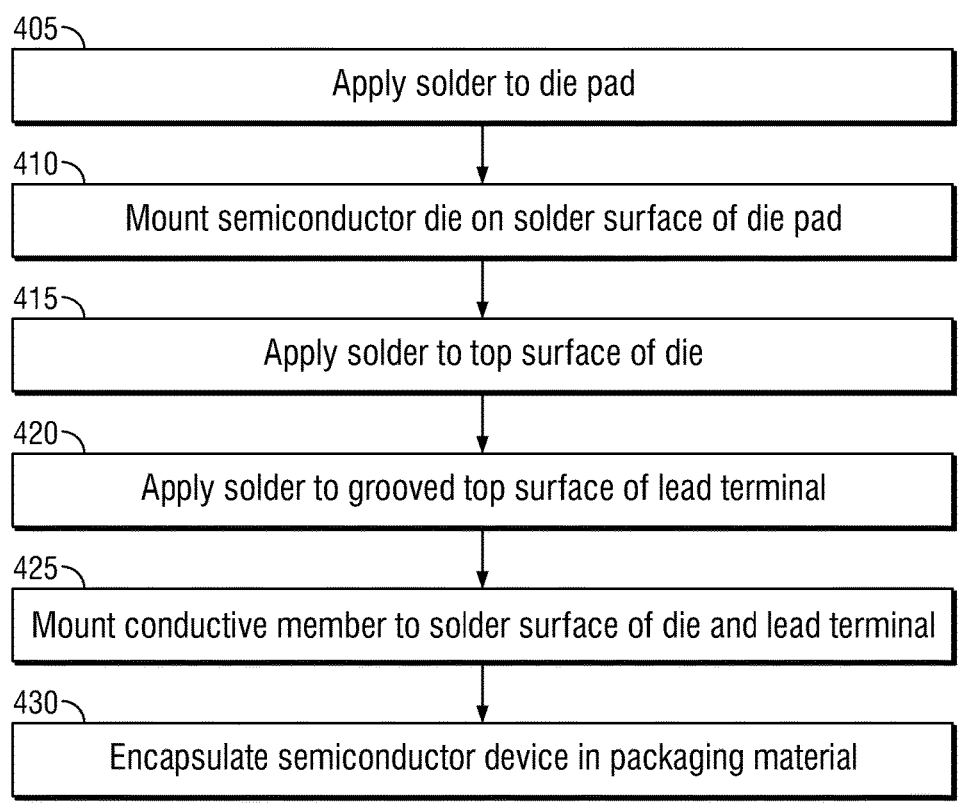
FIG. 5 is a flowchart showing one example of a method for forming a semiconductor package assembly having a clip for providing an electrical connection.

FIG. 5 is a flowchart showing one example of a method for forming a semiconductor package assembly having a clip for providing an electrical connection. The assembly process includes forming the lead frame and forming the clip structure, which includes forming grooves in the surface of the lead terminal that is to be electrically and mechanically connected to a conductive member, which is in turn electrically and mechanically connected to an electrode on a semiconductor die.

At block 405 solder is applied to one or more portions of the die pad 115 of the lead frame 120. A first surface of a semiconductor die 110 is mounted on the solder surface at block 410. The first surface may be a bottom surface of the die, but is not so limited in other embodiments. The bottom surface may be either of an anode or cathode of the die as appropriate to the device. Next at block 415 solder is applied to a second surface of the die 110. The second surface may be a top surface of the die, but is not so limited in other embodiments. The top surface may be either of an anode or cathode of the die as appropriate to the device. In addition, at block 420 solder is applied to the grooved top surface of the lead terminal 135. The conductive member 125 is mounted on the solder surfaces on the die 110 and the lead terminal 135. The conductive member 125 may be properly positioned or aligned on the die and the lead terminal using any suitable means. The resulting assembly is heated to cause the solder to undergo reflow at block 425. While the semiconductor assembly process described above uses solder to join the die to the other components of the device, alternative embodiments may use other conductive adhesive compounds to join the die to the other components of the device as appropriate to the device.

Finally, at block 430 a packaging enclosure is formed around the components of the semiconductor device. Forming the enclosure includes encapsulating or encasing the conductive die 110, the die pad 115, the conductive member 125 and the portion of the lead terminal 135 that includes distal joint B in an epoxy or other suitable compound as appropriate to the device and using processes as appropriate to the device.

It will be understood that spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an above and below orientation.

The invention claimed is:

1. A semiconductor assembly comprising:
    a semiconductor die comprising lower and upper electrical contacts;
    a lead frame having a lower die pad electrically and mechanically connected to the lower electrical contact of the die;
    an upper conductive member having a first portion electrically and mechanically connected to the upper electrical contact of the die with solder;
    a lead terminal having a surface portion electrically and mechanically connected to a second portion of the conductive member, the surface portion of only one of the lead terminal and the second portion of the conductive member having a series of grooves disposed therein, the grooves being configured to prevent shifting of the upper conductive member relative to the lead terminal during solder reflow; and
    packaging material encapsulating the semiconductor die, at least a portion of the lead frame, at least a portion of the upper conducive member and at least a portion of the lead terminal.

2. The semiconductor assembly of claim 1 wherein the series of grooves is disposed in the surface portion of the lead terminal.

3. The semiconductor assembly of claim 1 wherein the series of grooves is disposed in the second portion of the conductive member.

4. The semiconductor assembly of claim 1 wherein the grooves have a V-shaped profile.

5. The semiconductor assembly of claim 1 wherein the series of grooves define a pattern of parallel lines.

6. The semiconductor assembly of claim 1 wherein the series of grooves define a grid pattern.

7. The semiconductor assembly of claim 1 further comprising a first conductive adhesive compound electrically and mechanically connecting the surface portion of the lead terminal to the second portion of the conductive member.

8. The semiconductor assembly of claim 7 further comprising a second conductive adhesive compound electrically and mechanically connecting the first portion of the conductive member having to the upper electrical contact of the die.

9. The semiconductor assembly of claim 8 wherein the first and second conductive adhesive compounds include solder.

10. The semiconductor assembly of claim 1 wherein the semiconductor die is a diode.

11. The semiconductor assembly of claim 1 wherein the semiconductor die is a transient voltage suppressor.

12. The semiconductor assembly of claim 1 wherein the semiconductor die is an LED.

13. A method of forming a semiconductor assembly, comprising:
    applying solder to a die pad of a lead frame;
    positioning a semiconductor die on the die pad so that a lower electrode of the semiconductor die is in contact with the solder;
    applying solder to an upper electrode of the semiconductor die;
    forming a pattern of grooves in a surface portion of a lead terminal;
    applying solder to the surface portion of the lead terminal in which the grooves are formed;
    positioning a conductive member so that a proximal portion thereof on which no grooves are formed is in contact with the solder on the upper electrode of the semiconductor die and a distal portion thereof is in contact with the solder on the surface portion of the lead terminal in which the grooves are formed, the grooves being configured to prevent shifting of the upper conductive member relative to the lead terminal during solder reflow;
    applying heat to cause the solder on the upper electrode of the semiconductor die, the surface portion of the lead terminal and the die pad to reflow; and
    encapsulating the semiconductor chip, at least a portion of the lead frame, at least a portion of the upper conducive member and at least a portion of the lead terminal in packaging material.

14. The method of claim 13 wherein the grooves have a V-shaped profile.

15. The method of claim 13 wherein the series of grooves define a pattern of parallel lines.

16. The method of claim 13 wherein the series of grooves define a grid pattern.

17. A method of forming a semiconductor assembly, comprising:
    applying a conductive adhesive to a die pad of a lead frame;
    positioning a semiconductor die on the die pad so that a lower electrode of the semiconductor die is in contact with the conductive adhesive;
    applying conductive adhesive to an upper electrode of the semiconductor die;
    forming a pattern of grooves in a surface portion of a lead terminal;
    applying conductive adhesive to the surface portion of the lead terminal in which the grooves are formed;
    positioning a conductive member so that a proximal thereof portion on which no grooves are formed is in contact with the conductive adhesive on the upper electrode of the semiconductor die and a distal portion thereof is in contact with the conductive adhesive on the surface portion of the lead terminal in which the grooves are formed, the grooves being configured to prevent shifting of the upper conductive member relative to the lead terminal during solder reflow;
    applying heat to cause the conductive adhesive on the upper electrode of the semiconductor die, the surface portion of the lead terminal and the die pad to reflow; and encapsulating the semiconductor chip, at least a portion of the lead frame, at least a portion of the upper conducive member and at least a portion of the lead terminal in packaging material.

18. The method of claim 17 wherein the pattern of grooves includes a series of parallel grooves.

19. The method of claim 17 wherein the pattern of grooves includes a grid pattern.

\* \* \* \* \*